United States Patent
Durston et al.

(10) Patent No.: US 11,111,132 B2
(45) Date of Patent: Sep. 7, 2021

(54) MICRO ELECTROMECHANICAL SYSTEMS (MEMS) INERTIAL SENSOR

(71) Applicant: Atlantic Inertial Systems, Limited, Plymouth (GB)

(72) Inventors: Michael Durston, Plymouth (GB); Kevin Townsend, Liskeard (GB)

(73) Assignee: ATLANTIC INERTIAL SYSTEMS LIMITED, Plymouth (GB)

( * ) Notice: Subject to any disclaimer, the term of this patent is extended or adjusted under 35 U.S.C. 154(b) by 0 days.

(21) Appl. No.: 15/782,937

(22) Filed: Oct. 13, 2017

(65) Prior Publication Data

US 2018/0111826 A1  Apr. 26, 2018

(30) Foreign Application Priority Data

Oct. 25, 2016  (GB) .................................... 1618039

(51) Int. Cl.
*B81B 7/00* (2006.01)

(52) U.S. Cl.
CPC .... *B81B 7/0048* (2013.01); *B81B 2201/0235* (2013.01); *B81B 2201/0242* (2013.01); *B81C 2203/032* (2013.01)

(58) Field of Classification Search
CPC .......... B81B 7/0048; B81B 2201/0235; B81B 2201/0242
See application file for complete search history.

(56) References Cited

U.S. PATENT DOCUMENTS 6,184,064 B1 * 2/2001 Jiang ....................... H01L 24/32
257/739
6,257,060 B1   7/2001 Leonardson et al.
(Continued)

FOREIGN PATENT DOCUMENTS

CN       203368757 U    12/2013
DE     102014210006 A1   8/2015
(Continued)

OTHER PUBLICATIONS

Intellectual Property Office Search Report for International Application No. GB1618039.0 dated Mar. 2, 2017, 4 pages.
(Continued)

*Primary Examiner* — Laura M Menz
*Assistant Examiner* — Candice Chan
(74) *Attorney, Agent, or Firm* — Cantor Colburn LLP

(57) ABSTRACT

An micro electro mechanical sensor comprising: a substrate; and a sensor element movably mounted to a first side of said substrate; wherein a second side of said substrate has a pattern formed in relief thereon. The pattern formed in relief on the second side of the substrate provides a reduced surface area for contact with the die bond layer. The reduced surface area reduces the amount of stress that is transmitted from the die bond layer to the substrate (and hence reduces the amount of transmitted stress reaching the MEMS sensor element). Because the substrate relief pattern provides a certain amount of stress decoupling, the die bond layer does not need to decouple the stress to the same extent as in previous designs. Therefore a thinner die bond layer can be used, which in turn allows the whole package to be slightly thinner.

10 Claims, 4 Drawing Sheets

(56) References Cited

U.S. PATENT DOCUMENTS

| | | | |
|---|---|---|---|
| 6,750,521 B1* | 6/2004 | Chilcott | B81B 7/007 257/414 |
| 7,939,376 B2 | 5/2011 | Peltz et al. | |
| 9,187,313 B2 | 11/2015 | Eskridge et al. | |
| 9,926,188 B2 | 3/2018 | Classen et al. | |
| 2002/0093089 A1 | 7/2002 | Lu et al. | |
| 2010/0147075 A1 | 6/2010 | Magendanz et al. | |
| 2010/0300201 A1 | 12/2010 | Ge | |
| 2013/0105999 A1* | 5/2013 | Ding | B81B 7/0048 257/794 |
| 2015/0128703 A1 | 5/2015 | Kaelberer et al. | |
| 2016/0061677 A1 | 3/2016 | Han et al. | |
| 2016/0229688 A1* | 8/2016 | Gu | B81C 1/00547 |

FOREIGN PATENT DOCUMENTS

| | | |
|---|---|---|
| EP | 3356287 A1 | 8/2018 |
| EP | 3452406 A1 | 3/2019 |
| JP | 2012021964 A | 2/2012 |
| JP | 2013140084 A | 7/2013 |
| JP | 2013213772 A | 10/2013 |
| WO | 2016126405 A1 | 8/2016 |
| WO | 2017055029 A1 | 4/2017 |
| WO | 2017191365 A1 | 11/2017 |

OTHER PUBLICATIONS

European Search Report for Application No. 17197965.1-1230 dated Jan. 22, 2018, 7 pages.
Examination Report for GB Application No. 1618039.0, dated Jan. 23, 2020, 6 pages.
Examination Report Under Section 18(3) for Application No. GB1618039.0, dated Jun. 23, 2020, 4 pages.
JP Office Action for Application No. JP 2017-203036, dated Apr. 20, 2021 (English Translation), 6 pages.
JP Office Action for Application No. JP 2017-203036, dated Apr. 20, 2021, 6 pages.

* cited by examiner

Asymmetrical stress pattern

Symmetrical stress pattern

MICRO ELECTROMECHANICAL SYSTEMS (MEMS) INERTIAL SENSOR

FOREIGN PRIORITY

This application claims priority to Great Britain Patent Application No. 1618039.0 filed Oct. 25, 2016, the entire contents of which is incorporated herein by reference.

TECHNICAL FIELD

This disclosure relates to inertial sensors, in particular MEMS (micro electromechanical systems) sensors such as accelerometers and gyroscopes.

BACKGROUND

A typical inertial sensor product comprises a sensor mounted inside a package. The sensor is typically fixed to the package by means of a die bond layer. Wire bonds may be used to connect contacts on the sensor to the leads of the package. The package is then mounted to the structure of the vehicle in a suitable manner such as on a PCB or mounted together with other similar sensors for use.

Several different materials are involved in the structure and each material has a different coefficient of thermal expansion (CTE). This gives rise to stresses at the bonds between the various materials when the device experiences temperature changes. For example the MEMS sensor die is typically formed either as a Silicon on Glass arrangement or a Silicon on Silicon arrangement. In the former arrangement, the Silicon MEMS structure is sandwiched between an upper glass substrate and a lower glass substrate and is anodically bonded (or frit bonded) thereto so as to seal the MEMS structure inside the assembly. In the latter arrangement, Silicon substrates are used in place of glass substrates. The CTE of the glass can often be adjusted to be reasonably close to the CTE of the Silicon, e.g. by doping. However, the CTE of the die bond layer and the CTE of the package are typically significantly different.

The stresses from CTE mismatch between the MEMS and the package and the package and the vehicle structure are particularly problematic for MEMS sensors as the stresses are transmitted through to the MEMS sensor itself and these stresses give rise to changes in how the MEMS sensor responds to external impetus. For example, the bias and scale factor of the device are affected by these stresses.

Previous efforts to reduce the effects of CTE stresses have involved using a thick and compliant die bond layer to isolate the MEMS from the package. By using a compliant material for the die bond layer the stresses arising at the interface between the package and the die bond and the stresses arising at the interface between the die bond and the MEMS sensor can be absorbed to some extent. However, the die bond layer must be sufficiently thick in order to adequately decouple the stress. A thick die bond layer is undesirable as it makes alignment of the sensor die within the package more difficult (due to the slight fluidity of the die bond material during the curing process).

With existing devices, a factory calibration is carried out to compensate for the CTE effects that are still present in the device. However, there is a further problem that the die bond material changes properties with time, typically losing elasticity. This in turn changes the CTE stress transmission in the device to the extent that the factory calibration is no longer good enough.

In extreme cases of temperature change, the die bond layer can reach its glass transition temperature at which point it becomes much more rigid and produces discontinuities in the performance characteristics making it more difficult to compensate. While the die bond material is normally chosen so as to avoid this at normal operational temperatures, this puts an additional restriction on the choice of die bond materials from those available.

Stresses arising from CTE mismatch are particularly problematic for MEMS devices, particularly sensitive devices such as MEMS gyroscopes and accelerometers due to the mechanical nature of these sensors. In particular, the sensitivity of these devices is such that the asymmetry of the CTE stresses around the MEMS sensor is problematic. For example, to create a sensitive MEMS ring gyroscope, great care is taken to ensure that the MEMS ring structure has circular symmetry. However, the manufacturing process for the silicon structure (dicing from a wafer) normally results in a square or rectangular symmetry. This rectangular symmetry means that the CTE mismatch stresses are asymmetric around the sensor which adversely affects the performance of the sensor. The placement (i.e. the alignment) of the sensor with respect to the package also affects the transmission of these stresses significantly. Therefore these problems also apply to accelerometers with a rectangular symmetry. To isolate these asymmetric stresses, some attempts at stress isolation have used an interposer of small contact area to reduce the contact between the MEMS die and the package but this leads to problems with achieving and maintaining the alignment of the sensor (important for inertial sensors measuring real physical motion), maintaining adhesion during high g shock loads (another requirement of inertial sensors) and increases the complexity of the overall assembly process. Another solution has been to use complex dicing processes of the MEMS wafer to try to create a more symmetrical MEMS die. However this adds to the cost and complexity of the process and may reduce the yield of dies from the wafer.

SUMMARY

According to this disclosure, there is provided a MEMS sensor comprising: a substrate; and a sensor element movably mounted to a first side of said substrate; wherein a second side of said substrate has a pattern formed in relief thereon.

The pattern formed in relief on the second side of the substrate provides a reduced surface area for contact with the die bond layer. The reduced surface area reduces the amount of stress that is transmitted from the die bond layer to the substrate (and hence reduces the amount of transmitted stress reaching the MEMS sensor element).

Because the substrate relief pattern provides a certain amount of stress decoupling, the die bond layer does not need to decouple the stress to the same extent as in previous designs. Therefore a thinner die bond layer can be used, which in turn allows the whole package to be slightly thinner.

As the pattern is formed directly on the substrate of the sensor element, the pattern can be accurately aligned with the sensor element so that any stress that is transmitted through to the sensor element can be controlled by a suitable design of pattern. This reduces the accuracy with which the die bond layer needs to be deposited in the package, thus facilitating manufacture of an accurate sensor. Also as a smaller level of stress is transmitted from the die bond layer to the sensor die, the aging effects of the die bond material have less impact on sensor performance, thus allowing more freedom of choice in die bond material. With careful design a non-compliant die bond material can even be contemplated.

The overall structure of the sensor die is preferably of generally planar construction such that the first side and second side are generally planar opposite faces of the substrate. The patterning of the second side of the substrate provides deviation from the planar second face such that the pattern stands proud of the generally planar face. The first side may also have some surface relief as part of the MEMS sensor design but is not involved in the mounting. For example such surface relief on the first side may be to support or provide clearance from parts of the silicon MEMS structure (such as a suspended proof mass or ring) and it may include small surface details such as for tracking and interconnects.

The pattern may be formed from any suitable shapes and the pattern that is selected will generally depend on the particular design of the MEMS sensor. In some preferred examples the pattern may comprise one or more projections or ribs that stand proud of the surface.

It is preferred that the pattern is symmetrical in the sense that it has at least some form of symmetry. This could be mirror symmetry or rotation symmetry or both. Preferably at least one symmetry of the pattern corresponds to at least one symmetry of the sensor element. Thus, where the sensor element has rotational symmetry, the substrate pattern may also have rotational symmetry. Equally where the sensor element has mirror symmetry, the substrate pattern may also have mirror symmetry. Preferably the degree of symmetry is also the same, e.g. a sensor with 4-fold rotational symmetry is ideally matched by a pattern of 4-fold rotational symmetry. Alternatively, or additionally the symmetry of the pattern may reflect symmetry in other components of the sensor such as the symmetry of the transducers (e.g. drive transducers and/or pick-up transducers that drive and/or sense the MEMS movement). In some preferred examples the pattern has a 4-fold symmetry, optionally an 8-fold symmetry. The pattern may in some examples have a symmetry that substantially corresponds to the symmetry of the sensor element. For example a circularly symmetric pattern is well suited to a circular sensor element such as a gyroscope ring, while a square or rectangularly symmetric pattern is well suited to a square or rectangular accelerometer proof mass. Preferably the pattern complements the shape of the sensor element. It should be appreciated that symmetries should not be assessed on an exact basis. For example, a sensor ring may be supported by mounting legs that are not perfectly symmetrical, or in the case of accelerometers with interleaved capacitor fingers, the fingers may not be formed in an exactly symmetrical fashion. Such small differences may be ignored for the purposes of looking at the symmetry of the overall sensor shape and the overall pattern shape so long as the pattern shape adequately reduces the transferred stresses to the sensor element.

The exact form of the substrate pattern may vary significantly depending on the MEMS device that is mounted thereon. For example, the size and shape of the MEMS device, and/or the size and shape of transducers for the MEMS device may affect the size and shape of the pattern. The MEMS device may use different technologies for operation, e.g. it may be a capacitive device, an inductive device or a piezoelectric device. Each of these technologies may use slightly different constructions and transducer arrangements and may each require a different design of pattern on the substrate to minimise stress transfer and minimise the effect of stress transfer on the device's operation.

In some examples, the pattern may include one or more annular ribs. The annular ribs may be concentric with a circular component of a MEMS device (e.g. the ring of a ring gyroscope). In other examples, square or rectangular annular ribs may be provided and these may be concentrically or symmetrically arranged relative to a square or rectangular MEMS device (e.g. a proof mass of a linear accelerometer).

In other examples, the pattern may comprise a set of radially oriented ribs. These may essentially form a series of spokes radiating from a common centre point. The centre point may correspond to the centre of a circular MEMS sensor element such as the ring of a ring gyroscope. The ribs or spokes may all be joined at the centre, thus forming a star shape. In such cases, to avoid sharp angles in the pattern which are difficult to form accurately, the join between adjacent ribs is rounded. However, as this increases the surface area of contact of the pattern, it is preferred that the ribs or spokes are separate from each other (not joined at the centre). Thus each rib extends from a first radius to a second, larger radius. The first radius is selected to be large enough to ensure enough separation between adjacent ribs that the pattern is easily formed by the chosen manufacturing process. A circular projection may be formed at the centre point for additional support, this circular projection being separate from (not joined to) the ribs.

In some examples the ribs are preferably arranged in a circle at equal angular intervals. However, it will be appreciated that this is not essential and that other arrangements may be used. For example, pairs of ribs (or more generally groups of ribs) could be used such that the angular spacing between adjacent ribs is not constant (although it preferably varies in a repeating pattern, and as described above, it is preferred that the overall pattern is symmetrical).

The ribs may all be the same length. However, in some examples it is preferred that the ribs comprise a first set of ribs and a second set of ribs, the ribs of the first set being longer than the ribs of the second set. Such arrangements can be used to better compensate for the variations in the stress coupling pattern. For example, where a square die is used in a square package (the most common and convenient arrangement), the stresses arising from CTE mismatch are greatest along the diagonals of the square which are the largest dimension and thus experience the greatest overall stress. The stress pattern that arises in a square (or more generally rectangular) package thus varies angularly between highest stresses from the centre towards the corners of the square (or rectangle) and lowest stresses from the centre towards the edge (the shortest dimension). Although the pattern is intended to decouple as much as possible of this stress from the MEMS die, some residual stress is coupled through to the MEMS die. In order to couple this stress better (in a manner which has least adverse effect on sensor operation), the pattern on the MEMS substrate may have ribs with lengths that vary in a similar way to the stress pattern. Preferably longer ribs are provided in areas of higher stress and shorter ribs are provided in areas of lower stress. In this way the stresses caused within the silicon on glass (or silicon on silicon) structure and the stresses induced by the packaging can be coupled in such a way as to balance out the stress coupling so as to create as close as possible to an ideal, symmetrical stress pattern that will have the least effect on the MEMS sensor itself.

Thus in some preferred examples, the sensor has a rectangular shape and the ribs of the first set extend closer to the diagonals of the rectangle than the ribs of the second set. As described above, the ribs may extend from a first radius to a second, larger radius. The variation in rib length may be accomplished in any suitable way, e.g. by varying either or both of the inner radius and outer radius. For example, the ribs could be formed with the same outer radius and with different inner radii according to rib length. However, it is preferred that the ribs all have the same inner radius and have different outer radii according to rib length as the square (or rectangular) shape of the substrate permits greater rib length variation in such arrangements.

Preferably the pattern is raised from the second side of the substrate by a distance sufficiently large that it separates the remainder of the second side from the die bond material. In other words the depth of the pattern (or height of relief of the pattern) is high enough that the non-pattern area of the second side of the substrate does not contact the die bond material so that stress is not coupled into the non-pattern areas of the substrate surface. As described above, typical die bond materials are often elastic and may have a certain amount of fluidity during the curing process for adhering the die bond to the package and substrate. Therefore the pattern height is selected so as to ensure that the only contact between substrate and die bond after curing is through the patterned area of the substrate.

This disclosure applies to sensors made from many different constructions and from different materials, however in some preferred examples the substrates are formed from glass and the sensor element is formed from silicon (so-called Silicon-On-Glass construction). Any suitable technique may be used to shape the surface of the substrate so as to form the pattern. However, in these Silicon-On-Glass examples, the pattern may be formed by powder blasting or wet etching for example.

In other preferred examples the substrates may be formed from silicon and the sensor element may also be formed from silicon (so-called Silicon-On-Silicon construction). Again, any suitable technique may be used to shape the surface of the substrate so as to form the pattern. However, in these Silicon-On-Silicon examples, the pattern may be formed by deep reactive ion etching for example.

According to another aspect, this disclosure provides a packaged sensor comprising: a package; a die bond layer adhered to the package; and a sensor as described above, (optionally including any or all of the optional features described above) with the pattern of its second surface adhered to the die bond layer.

The die bond layer thickness may vary depending on the particular application, e.g. depending on the size of the package and MEMS die. However, in some preferred examples the die bond layer has a thickness of no more than 100 μm, preferably no more than 50 μm. This compares to previous thick die bond thicknesses of around 250 μm.

Also, as discussed above, although a compliant die bond layer is a common choice, in some examples of this disclosure the die bond layer may be a non-compliant material.

Some examples of suitable compliant materials include silicone elastomers, compliant acrylate or compliant epoxy based die bond adhesives. Higher rigidity (non-compliant) materials may include a non-compliant epoxy.

BRIEF DESCRIPTION OF DRAWINGS

One or more non-limiting examples will now be described, by way of example only, and with reference to the accompanying figures in which.

DETAILED DESCRIPTION

Figure 1:
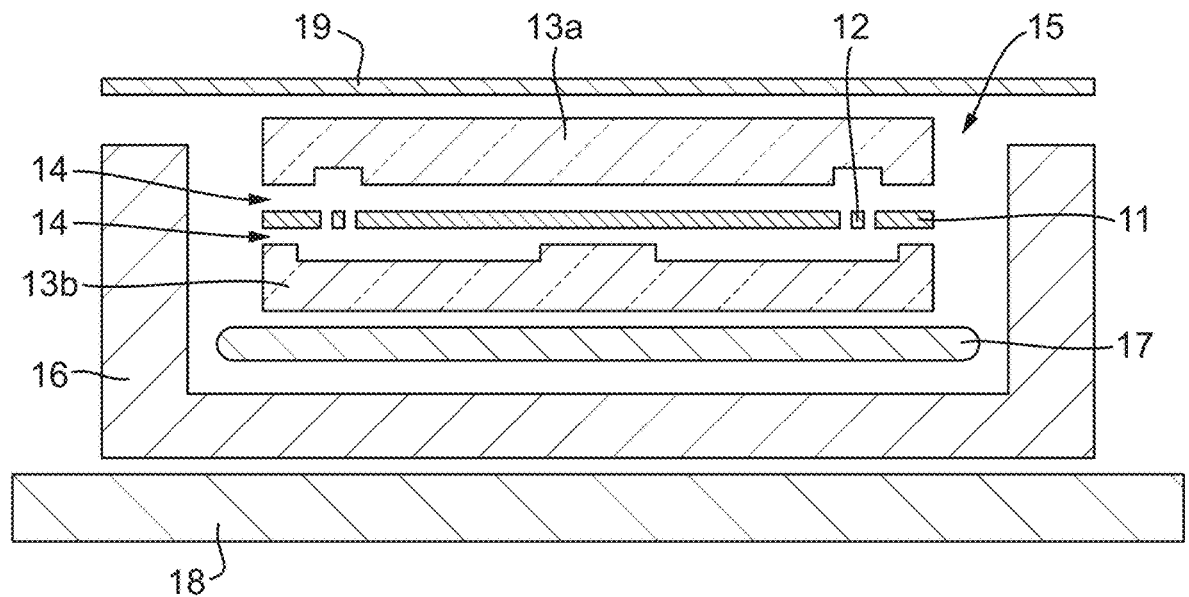
FIG. 1 shows an exploded cross-section view of a typical prior art construction.

FIG. 1 shows an exploded cross-section view of a typical prior art construction and mounting of a MEMS package with a thick die bond layer. The MEMS die 15 is formed in this example using Silicon on glass construction. A silicon layer 11 has the MEMS sensor formed therein, e.g. by etching. In this example, a gyroscope ring 12 is etched into the silicon layer 11. The silicon layer 11 is sandwiched between two glass substrate layers 13a, 13b. The silicon layer 11 is bonded to the glass layers 13a, 13b either by anodic bonding or frit bonding around the edges as indicated by arrows 14. Together the silicon layer 11 and glass layers 13a, 13b form the MEMS die 15.

The MEMS die 15 is mounted within a package 16 via a thick die bond layer 17. A lid 19 is provided to seal the package in conventional manner. The die bond layer is typically around 250 μm thick and is of a compliant material so that it can adequately absorb the stresses that arise due to differing coefficients of thermal expansion in the MEMS die 15, the package 16 and the PCB 18 (or other alternative mounting surface if applicable). The bottom surface of the lower glass substrate 13b is in full contact with the die bond layer 17.

Figure 2:
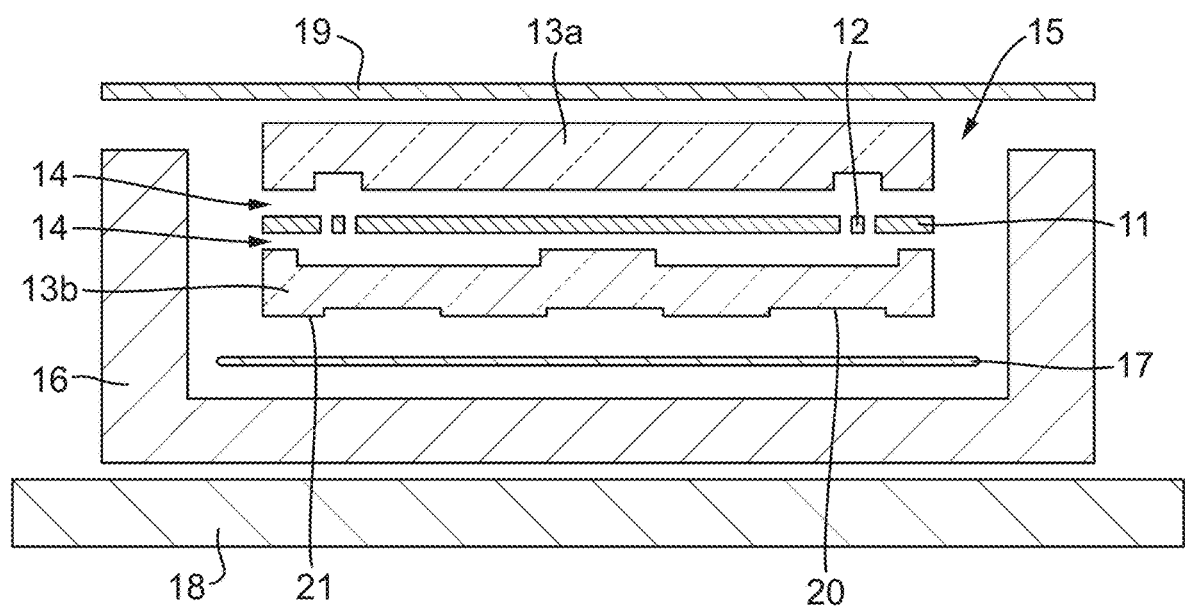
FIG. 2 shows an exploded cross-section view of a construction and mounting of a MEMS package according to certain examples of this disclosure.

FIG. 2 shows an exploded cross-section view of a construction and mounting of a MEMS package according to certain examples of this disclosure. The majority of the construction is the same as is shown in FIG. 1 and the same reference numbers are used. However the two key differences are that the bottom surface 20 of the lower substrate 13b is patterned with a relief pattern 21 and the die bond layer 17 is significantly thinner than the prior art construction of FIG. 1.

The relief pattern 21 on the lower substrate 13b is of sufficient relief (i.e. the pattern extends proud from the rest of the surface 20 by a sufficient amount) that the die bond layer 17 does not contact the non-pattern part of the surface 20. Thus the stresses that arise between the PCB 18 and the package 16 and between the package 16 and the MEMS die 15 are transmitted only via the patterned part 21 of the surface 20.

Figure 3:
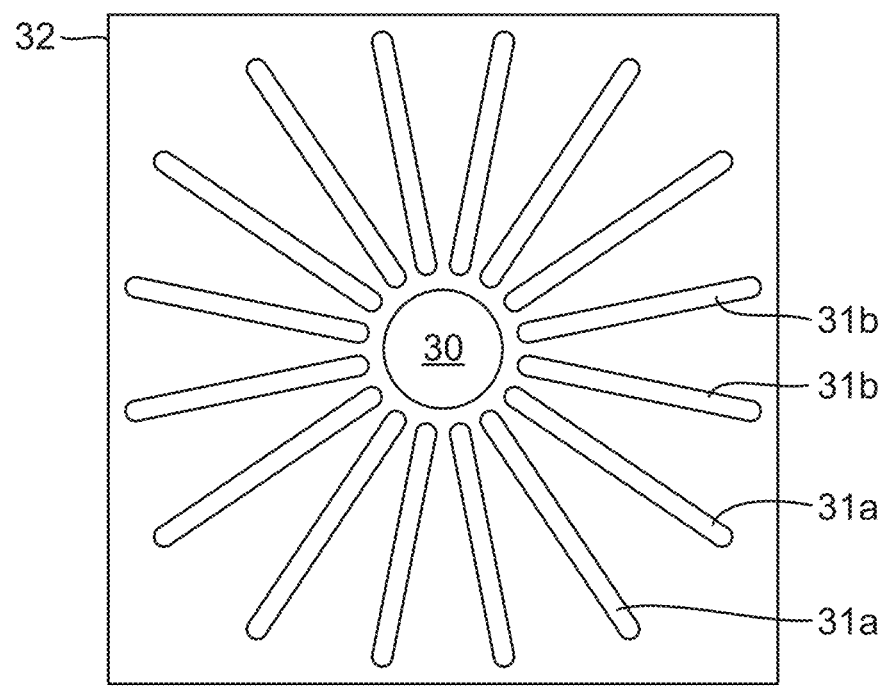
FIG. 3 shows one example of a pattern.

FIG. 3 shows one example of a pattern that may be used on the bottom surface 20 of substrate 13b. The shaded part of FIG. 3 shows the patterned part of surface 20, i.e. the part of surface 20 that projects out from the rest of the surface 20 and which is in contact with the die bond layer 17 in use.

The pattern of FIG. 3 comprises a central circular projection 30 surrounded by sixteen radial ribs 31, each extending from a first inner radius to a second outer radius. In this particular example, all ribs 31 share a common first inner radius, but the ribs 31 can be divided into two sets, each of which has a different outer radius. The first set 31a are the longer ribs and extend to an outer radius that is radially further out than the outer radius of the second set 31b of shorter ribs. The rectangular (more specifically square in this example) outer perimeter of the substrate 13b is shown at 32. It can be appreciated that the pattern has four-fold rotational symmetry, matching the rotational symmetry of the substrate 13b. The pattern also has reflection symmetry about both the horizontal and vertical axes (as seen in FIG. 3) and around both diagonals of the square substrate 13b. In this example, the ribs 31a, 31b are arranged such that a long rib 31a is arranged either side of each diagonal (these being the longest radial lengths from the centre of the substrate 13b to the corners thereof) and a short rib 31b is arranged either side of each of the horizontal and vertical axes (these being the shortest radial lengths from the centre of the substrate 13b to the mid-points of each side thereof). The longer ribs 31a are thus closer to the diagonals than the shorter ribs 31b. This variation in rib length matches the stresses that arise due to the asymmetry of the substrate and thus reduces the effect of the asymmetry as residual stresses are coupled into the MEMS structure. It will be appreciated that the symmetries of the pattern correspond to symmetries of the sensor element (in the illustrated case this is a ring of a vibrational ring gyroscope, although this disclosure is not limited to such examples).

It will be appreciated that in variations of the pattern shown in FIG. 3, the pattern could be arranged such that ribs 31 lie on the diagonals (and/or on the vertical and horizontal axes). The rotational and mirror symmetries would still be maintained. The number of long ribs 31a and short ribs 31b may be varied, e.g. with only one of each long rib, and/or only one of each short rib, and/or more than two of each long rib, and/or more than three of each short rib. There may also be more than two sets of ribs, i.e. more than three distinct lengths of rib. In this case, the longest ribs are still preferably arranged on or close to the diagonals with rib length decreasing towards the horizontal and vertical substrate axes.

Figure 4:
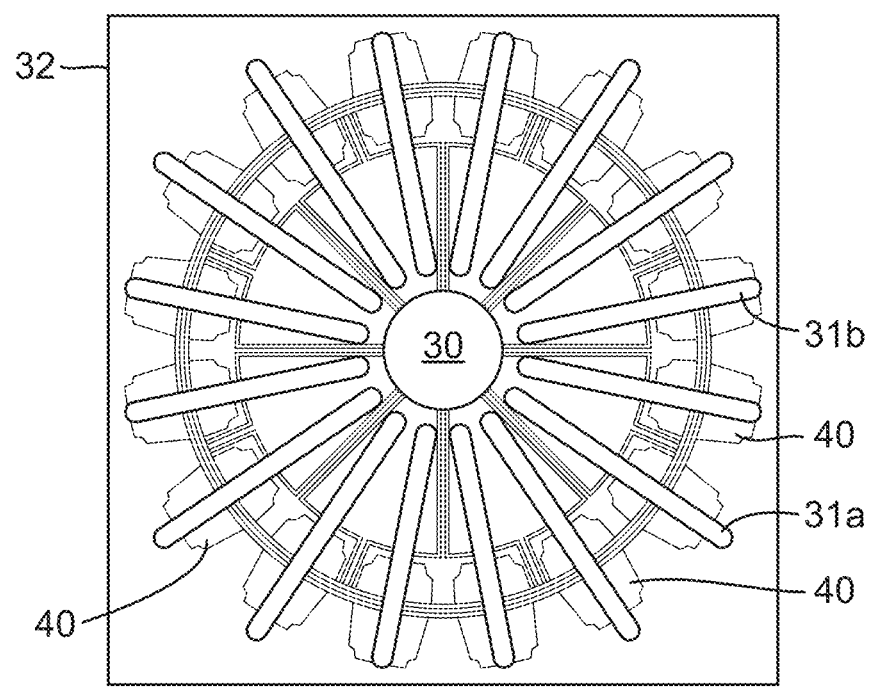
FIG. 4 shows the pattern of FIG. 3 overlaid on some sensor structure.

FIG. 4 shows the pattern of FIG. 3 overlaid on the structure of the MEMS device and transducers therefor. It can be seen that the ribs 31a, 31b are symmetrically arranged with respect to the MEMS device and transducers. Each of the sixteen ribs 31a, 31b overlays a transducer 40 of the MEMS device so that stresses are coupled in line with the transducers 40.

Figure 5A:
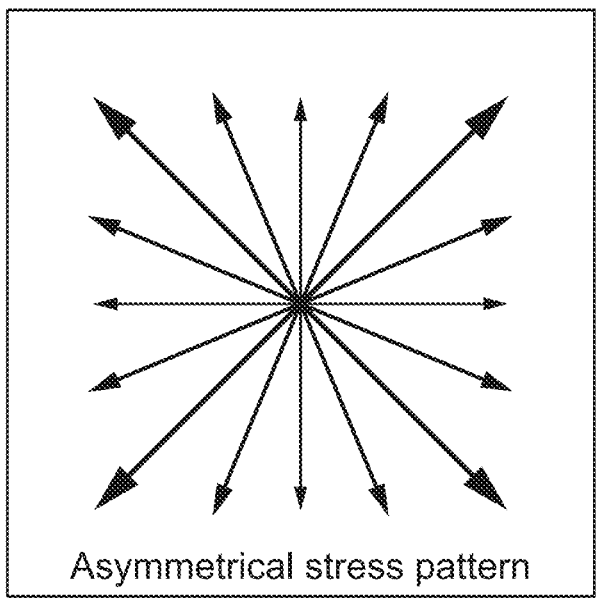
FIGS. 5a and 5b show a comparison of stress patterns for patterned and non-patterned substrates.

FIG. 5a illustrates the asymmetrical stress pattern that arises in the MEMS die 15 in a typical prior art arrangement. The length and thickness of each arrow illustrate the amount of stress induced in the die 15. It can be seen that the largest stresses are in line with the longest radii of the substrate 13b, i.e. the diagonals, while the smallest stresses are towards the mid-points of each side (i.e. the shortest radii of the substrate 13b). It is this asymmetrical stress coupling that causes problems with the MEMS device, e.g. through deformation of the MEMS structure which causes asymmetrical changes in the alignment of the transducers, disruption of the alignment of the resonant modes and balancing of the mode frequencies, that can lead to bias, scale factor errors and performance degradation.

Figure 5B:
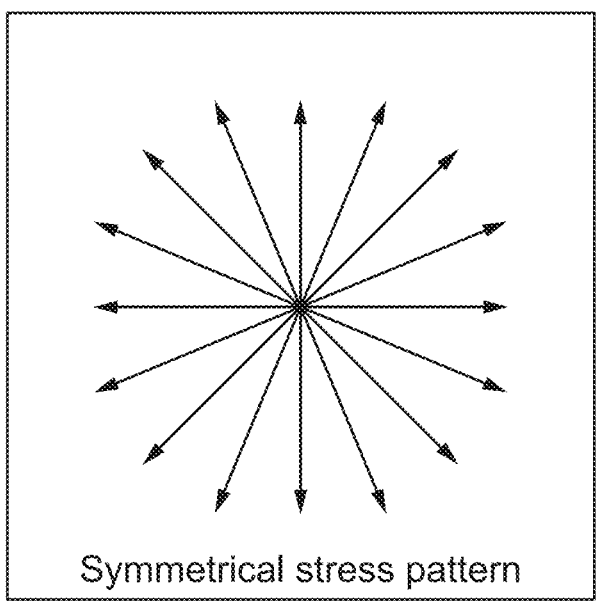

FIG. 5b illustrates the symmetrical stress pattern that arises when the patterned substrate e.g. of FIG. 3 is used. It can be seen that the arrows now have the same thickness and length indicating that the stress has been coupled in more evenly with respect to the MEMS structure.

Figure 6:
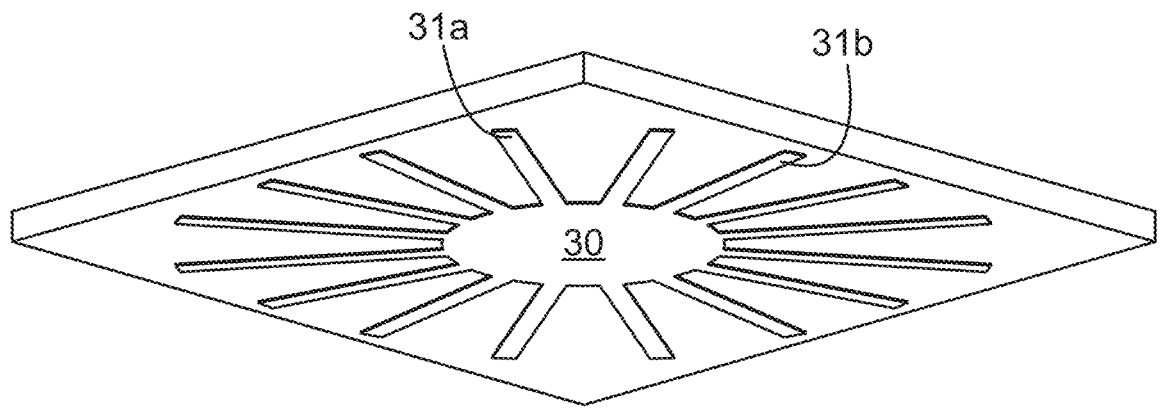
FIG. 6 shows another example of a pattern.

FIG. 6 shows a perspective view of a substrate 13b with a pattern 21 on its bottom surface 20. The pattern is similar to that shown in FIG. 3, except that each of the ribs 31 is connected to the central hub 30. It can be seen that the hub 30 is larger in this example so is to avoid sharp etching angles between adjacent ribs 31.

Figure 7:
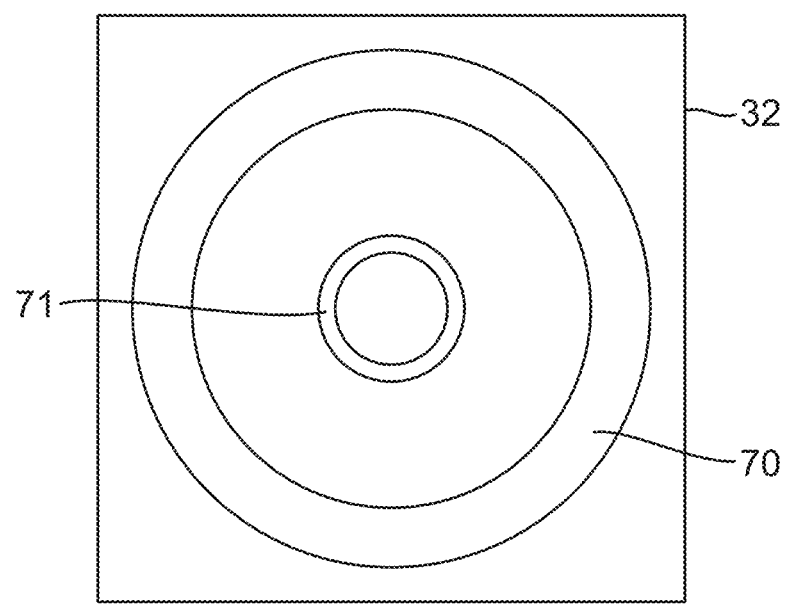
FIG. 7 shows a further example of a pattern.

FIG. 7 shows an alternative pattern 21 that can be used on the bottom surface 20 of substrate 13b. The pattern 21 of FIG. 7 comprises two concentric annular rings, each of which stands proud of the rest of the surface 20. In this example two rings are shown; an outer ring 70 and an inner ring 71, although in other examples more than two rings may be used. The rings 70, 71 do not provide the same degree of control that is available with the ribs 31, but they still reduce the stress coupling by reducing the surface area of contact between the die bond layer 17 and the substrate 13b, thus reducing the amount of stress that is coupled into the MEMS die 15.

In the case of all of the examples (FIGS. 3, 6 and 7), the pattern 21 provides support for the MEMS die 15 across substantially the whole width of the substrate 13b. This is achieved by providing contact points (i.e. parts of the relief pattern) at radially outer points of the substrate 13b (in particular more than a quarter of a side length from the centre of the substrate 13b, more preferably more than three eighths of a side length from the centre of the substrate 13b). Thus the MEMS die 15 is stably supported on the die bond layer 17, but still with reduced stress coupling therewith.

By way of example and illustration, in a typical silicon on glass MEMS die structure, the MEMS die has a thickness of around 700 μm, a width of around 5000 μm and length of around 5000 μm. Package dimensions for this die are typically around 8 mm by 8 mm by 2.2 mm thick.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

The invention claimed is:

1. A micro electromechanical systems (MEMS) sensor that is an accelerometer or a gyroscope comprising:
   a substrate; and
   a sensor element movably mounted to a first side of said substrate;
   wherein a second side of said substrate has a pattern formed in relief thereon; and
   wherein the sensor element has a rotational symmetry and wherein the pattern has a rotational symmetry that substantially corresponds to the symmetry of the sensor element to minimize the effect of stress transfer on the sensor operation; and wherein the pattern comprises a set of radially oriented ribs.

2. A sensor as claimed in claim 1, wherein the pattern has a 4-fold or 8-fold symmetry.

3. A sensor as claimed in claim 1, wherein the ribs are arranged in a circle at equal angular intervals.

4. A sensor as claimed in claim 3, wherein the ribs comprise a first set of ribs and a second set of ribs, the ribs of the first set being longer than the ribs of the second set.

5. A sensor as claimed in claim 4, wherein the sensor has a rectangular shape and wherein the ribs of the first set extend closer to the diagonals of the rectangle than the ribs of the second set.

6. A sensor as claimed in claim 1, wherein the substrate is formed from glass and the sensor element is formed from silicon.

7. A sensor as claimed in claim 6, wherein the pattern is formed by powder blasting or wet etching.

8. A sensor as claimed in claim 1, wherein the substrate is formed from silicon and the sensor element is formed from silicon.

9. A packaged sensor comprising:
    a package;
    a die bond layer adhered to the package; and
    a sensor that is an accelerometer or a gyroscope and that includes:
        a substrate; and
        a sensor element movably mounted to a first side of said substrate;
    wherein a second side of said substrate has a pattern formed in relief thereon with the pattern of its second surface adhered to the die bond layer; and
    wherein the sensor element has a rotational symmetry;
    wherein the pattern has a rotational symmetry that substantially corresponds to the rotational symmetry of the sensor element to minimize the effect of stress transfer on the sensor operation; and
    wherein the pattern comprises a set of radially oriented ribs.

10. An micro electromechanical systems (MEMS) sensor system comprising:
    a package;
    a sensor that is an accelerometer or a gyroscope and that includes:
        a substrate; and
        a sensor element movably mounted to a first side of said substrate;
    wherein a second side of said substrate has a pattern formed in relief thereon;
    wherein the sensor element has a rotational symmetry;
    wherein the pattern minimizes effects of stress transfer on the sensor operation by having a rotational symmetry that substantially corresponds to the rotational symmetry of the sensor element; and
    wherein the pattern comprises a set of radially oriented ribs.

* * * * *